(12) United States Patent
Lai et al.

(10) Patent No.: US 12,380,948 B2
(45) Date of Patent: Aug. 5, 2025

(54) RRAM VOLTAGE COMPENSATION

(71) Applicant: Taiwan Semiconductor Manufacturing Company, Ltd., Hsinchu (TW)

(72) Inventors: Chien-An Lai, Hsinchu (TW); Chung-Cheng Chou, Jsomcji (TW); Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/721,985

(22) Filed: Apr. 15, 2022

(65) Prior Publication Data

US 2022/0238155 A1 Jul. 28, 2022

Related U.S. Application Data

(63) Continuation of application No. 17/135,169, filed on Dec. 28, 2020, now Pat. No. 11,309,022, which is a continuation of application No. 16/502,671, filed on Jul. 3, 2019, now Pat. No. 10,878,902.

(60) Provisional application No. 62/698,693, filed on Jul. 16, 2018.

(51) Int. Cl.
 *G11C 13/00* (2006.01)
 *G11C 7/04* (2006.01)
 *G11C 7/10* (2006.01)

(52) U.S. Cl.
 CPC ........... *G11C 13/0028* (2013.01); *G11C 7/04* (2013.01); *G11C 7/1063* (2013.01); *G11C 13/0026* (2013.01); *G11C 13/003* (2013.01); *G11C 13/0038* (2013.01); *G11C 13/004* (2013.01); *G11C 13/0069* (2013.01); *G11C 2013/0045* (2013.01); *G11C 2013/0078* (2013.01)

(58) Field of Classification Search
 CPC .................. G11C 13/0028; G11C 13/0038
 USPC .......................................................... 365/148
 See application file for complete search history.

(56) References Cited

U.S. PATENT DOCUMENTS

| | | | |
|---|---|---|---|
| 7,755,946 B2 | 7/2010 | Dunga et al. | |
| 8,199,581 B2 | 6/2012 | Kim | |
| 8,427,878 B2 | 4/2013 | Shim et al. | |
| 10,878,902 B2 | 12/2020 | Lai et al. | |
| 2008/0316830 A1* | 12/2008 | Yang | G11C 16/30 365/185.18 |
| 2011/0188289 A1* | 8/2011 | Chevallier | G11C 13/003 365/210.1 |
| 2014/0140130 A1 | 5/2014 | Song et al. | |
| 2014/0169101 A1 | 6/2014 | Choi et al. | |
| 2018/0025778 A1* | 1/2018 | Mori | G11C 13/0002 365/148 |
| 2018/0061504 A1* | 3/2018 | Kim | G11C 7/04 |
| 2019/0103161 A1 | 4/2019 | Chevallier et al. | |

* cited by examiner

*Primary Examiner* — Anthan Tran
(74) *Attorney, Agent, or Firm* — Merchant & Gould P.C.

(57) ABSTRACT

A memory device includes an array of resistive memory cells with a plurality of word lines connected to the array of resistive memory cells. A voltage compensation controller is configured to determine a word line voltage to be applied to a selected word line of the plurality of word lines. A word line driver is configured apply the determined word line voltage to the selected word line.

20 Claims, 12 Drawing Sheets

| [C1 C2] | 10 | 01 | 11 |
|---|---|---|---|
| G1 | 0 | 1 | 0 |
| G2 | 0 | 0 | 1 |
| G3 | 1 | 0 | 0 |

RRAM VOLTAGE COMPENSATION

CROSS-REFERENCE TO RELATED APPLICATION

This application is Continuation of U.S. patent application Ser. No. 17/135,169, filed Dec. 28, 2020, which is a Continuation of U.S. patent application Ser. No. 16/502,671, filed Jul. 3, 2019, which claims priority to U.S. Provisional Patent Application No. 62/698,693, filed Jul. 16, 2018, in which the disclosure of each is hereby incorporated by reference in its entirety.

BACKGROUND

Integrated circuit (IC) memory devices include resistive memory, such as resistive random-access memory (RRAM), magnetoresistive random-access memory (MRAM), phase-change random-access memory (PCRAM), etc. For instance, RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1".

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
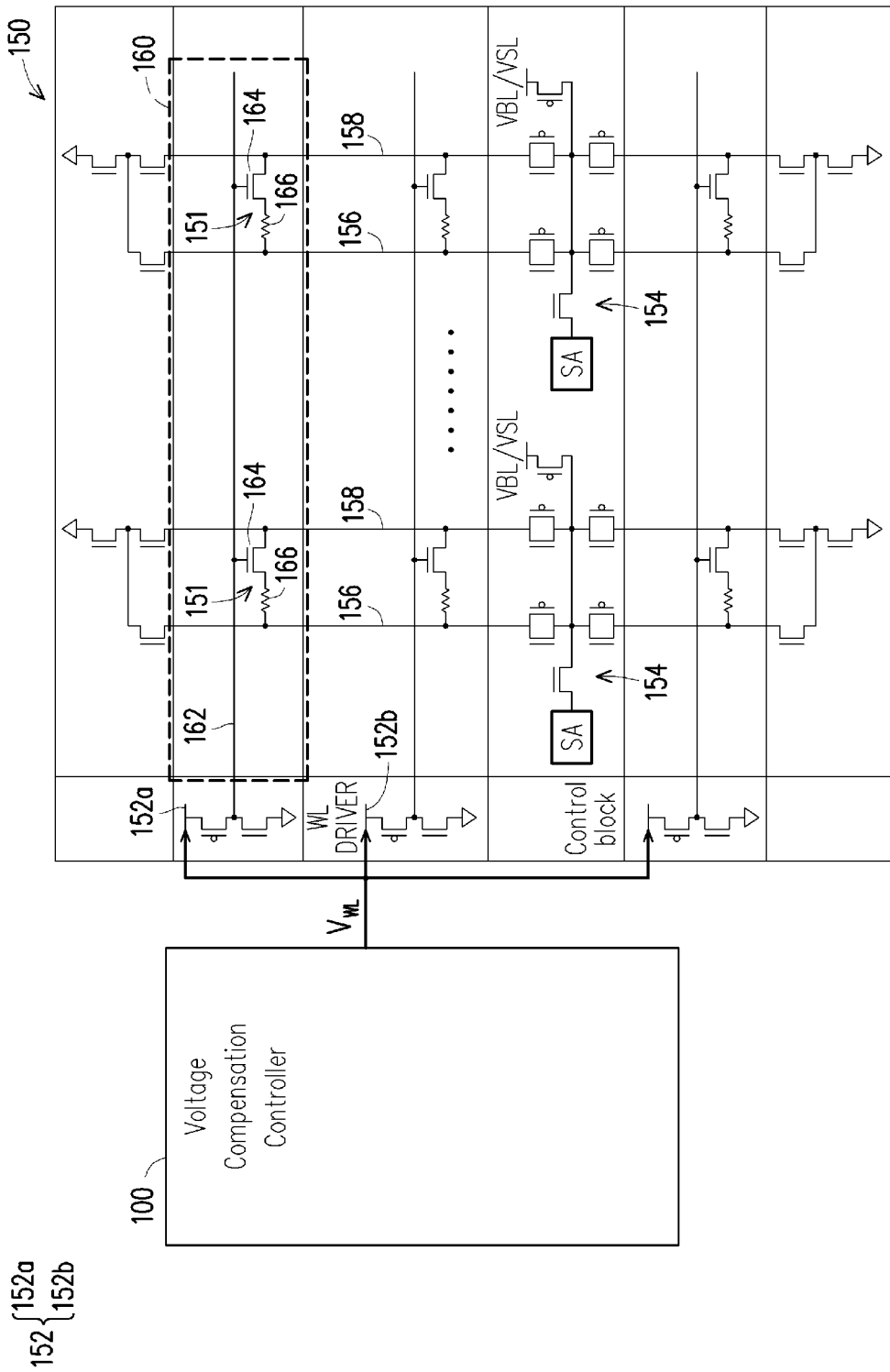
FIG. 1 is a block diagram generally illustrating an example voltage compensation controller operatively coupled to an array of resistive memory cells in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some Integrated circuit (IC) memory devices, such as resistive random-access memory (RRAM), variation in bit-line (BL)/source-line (SL) current during read/write operations occurs as a function of the location of a memory cell along the BL/SL. Variation in BL/SL current can also occur as a function of temperature as well. For read/write operations, there currently is no area/time efficient way to compensate for these variations, which potentially could cause data reliability issues.

In some embodiments, the resistive memory circuit comprises a resistive memory array having a plurality of cells. A word line driver is configured to apply a first read/write voltage to a word line coupled to a row of resistive memory cells comprising a selected resistive memory cell. A bit line (BL)/source line (SL) driver within an input-output block (I/O block) is configured to apply a second read/write voltage to a bit line coupled to the selected resistive memory cell. A voltage compensation controller is operatively connected to the word line driver and configured to determine the first read/write voltage to apply to the selected word line. By adjusting the word line voltage applied to the selected word line based on the location of the selected word line, e.g. the distance of the selected word line from the I/O block, variation in the BL/SL current may be reduced. Further adjustment of the word line voltage applied to the selected word line based on temperature may also mitigate the decrease in read margin at higher temperatures due to transistor temperature effects and parasitic resistance.

FIG. 1 is a block diagram generally illustrating an example of a voltage compensation controller 100 operatively coupled to a word line driver of an array 150 of resistive memory cells 151 in accordance with certain aspects of the present disclosure. Each of the resistive memory cells 151 of the array 150 includes a resistive element 166 having a layer of high-k dielectric material arranged between conductive electrodes disposed within a back-end-of-the-line (BEOL) metallization stack. Resistive memory devices are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. A resistive memory cell having a first (e.g., high) resistive state corresponds to a first data value (e.g., a logical '0') and A resistive memory cell having a second (e.g., low) resistive state corresponds to a second data value (e.g., a logical '1').

The illustrated array 150 includes a plurality of the resistive memory cells 151. For simplicity, only three resistive memory cells 151 are shown in FIG. 1; a typical resistive memory array would include many more resistive memory cells. The resistive memory cells 151 are arranged within the array 150 in rows and/or columns. The resistive memory cells 151 within a row of the array 150 are operably coupled to a word line (WL) 162, and resistive memory cells 151 within a column of the array 150 are operably coupled to a bit line (BL) 156 and a source line (SL) 158. The plurality of resistive memory cells 151 are respectively associated with an address defined by an intersection of a word line 162 and a bit line 156.

Each of the resistive memory cells 151 includes a resistive memory element 166 and an access transistor 164. The resistive memory element 166 has a resistive state that is switchable between a low resistive state and a high resistive state. The resistive states are indicative of a data value (e.g., a "1" or "0") stored within the resistive memory element 166. The resistive memory element 166 has a first terminal coupled to the bit line 156 and a second terminal coupled to the access transistor 164. The access transistor 164 has a gate coupled to the word line 162, a source coupled to the source line 158 and a drain coupled to the second terminal of the resistive memory element 166.

The array 150 is configured to read data from and/or write data to the plurality of resistive memory cells 151. A word line signal, such as a word line voltage $V_{WL}$ is applied to one of the word lines 162 based on a received word line address, and bit line/source line signals are applied to appropriate bit lines 156 and source lines 158. By selectively applying signals to the word lines 162, bit lines 156, and source lines 158, forming, set, reset, and read operations may be performed on selected ones of the plurality of resistive memory cells 151. For example, to read data from resistive memory cell 151, a word line voltage $V_{WL}$ is applied to the word line 162, and BL/SL voltages (VBL/VSL) are applied to the bit line 156 and a source line 158. The applied signals cause a sense amplifier to receive a signal having a value that is dependent upon a data state of the resistive memory cell 151. In some embodiments, the array 150 can include a plurality of bit lines 156, source lines 158, and word lines 162. For example, the plurality of bit lines 156 and source lines 158 can be arranged to apply BL/SL voltages to a plurality of resistive memory cells 151 arranged in columns, and word line voltages $V_{WL}$ can be applied to the plurality of word lines 162 to access the plurality of resistive memory cells 151 in each column.

In some embodiments, the array 150 further includes word line drivers 152a, 152b (collectively word line drivers 152) and at least one input-output (I/O) control block 154. The I/O control block 154 applies the BL/SL voltages (VBL/VSL) to bit lines 156 and source lines 158 during read-write operations. In some embodiments, the I/O control block 154 includes circuitry for multiplexing and encoding, and demultiplexing and decoding data to be written to, or read from, the array 150 or resistive memory cells 151, as well as circuitry for pre-charging the bit lines 156 and source lines 158 for read-write operations. In some embodiments, the I/O control block 154 includes circuitry for amplifying read-write signals received from or applied to the bit lines 156 and source lines 158. In general, the I/O control block 154 includes the circuitry necessary to control the bit lines 156 and source lines 158 voltages for all SET, RESET, and READ operations executed on the array 150 or resistive memory cells 151.

The voltage applied to the gate of the access transistor 164 may be used to control the current flowing through the resistive element 166, and therefore may be used to compensate for bit line current variations due to higher source line voltage for cells nearer to the I/O control block 154. Higher source line voltage for cells nearer to the I/O control block 154 can be caused by, for example, parasitic resistance from other elements in the array 150 of resistive memory cells 151, and current variations in the access transistor 164. Current variations in the access transistor 164 can be caused by temperature variations and threshold voltage variations from, for example, the body effect of a MOSFET. Variations in the current flowing through the resistive element 166 may reduce the reliability of reading/writing data to the resistive element 166. The voltage compensation controller 100 may be configured to determine a word line voltage $V_{WL}$ to be applied to the gate of the access transistor 164 to compensate for bit line current variations and increase the reliability of read/write operations to the resistive element 166.

Figure 2:
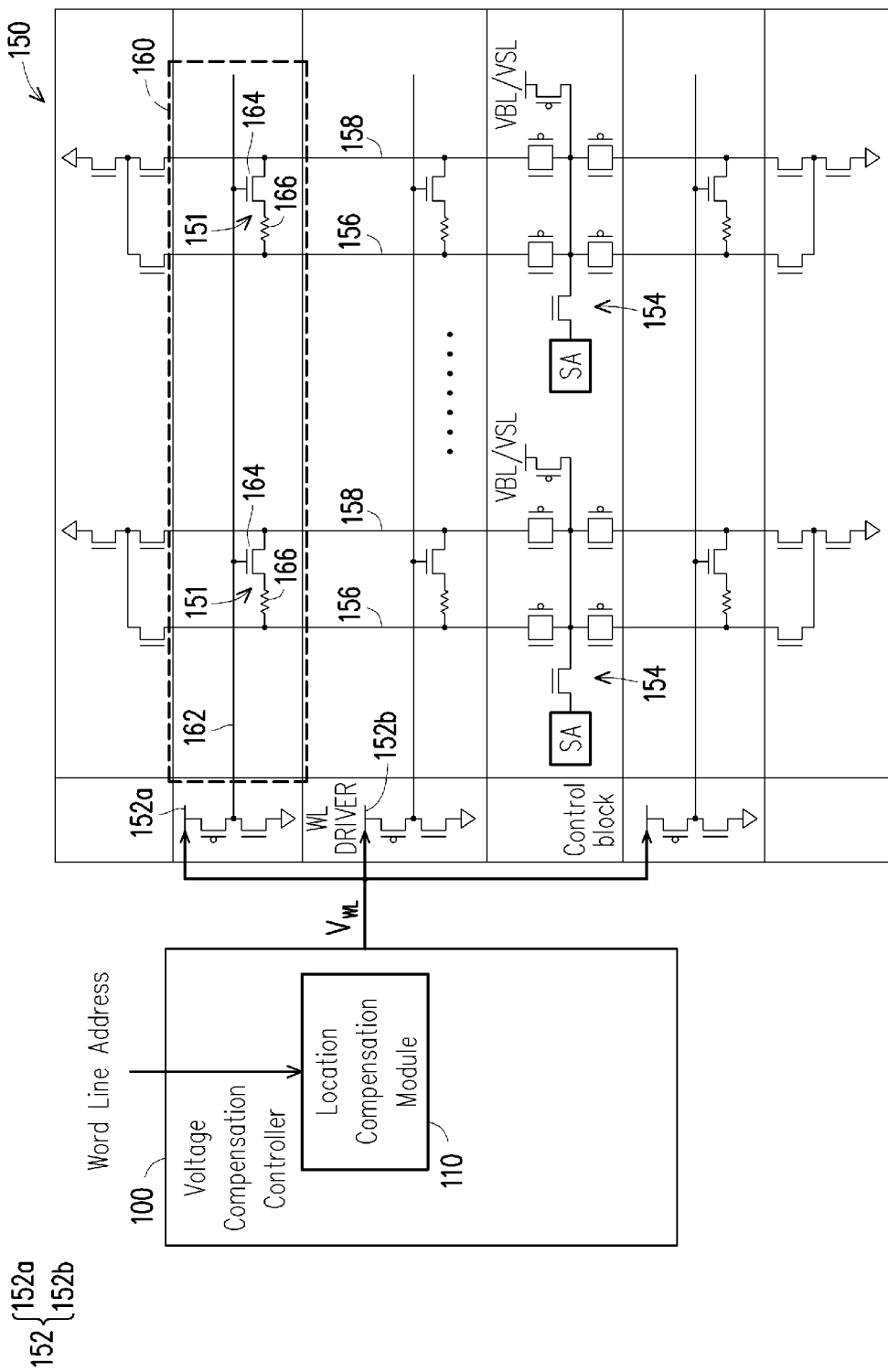
FIG. 2 is a block diagram generally illustrating another example voltage compensation controller operatively coupled to an array of resistive memory cells in accordance with some embodiments.

FIG. 2 is a block diagram generally illustrating another example of a voltage compensation controller 100 operatively coupled to a word line driver of an array 150 of resistive memory cells 151 in accordance with certain aspects of the present disclosure. In the example shown, the voltage compensation controller 100 includes a location compensation module 110. The location compensation module 110 may be configured to determine a word line voltage that is based on the location of a selected word line 162 relative to the VBL/VSL voltage terminal of the I/O control block 154. For example, the location compensation module 110 may determine a word line voltage based on the distance of the word line 162 connected to the memory cells of row 160 from the I/O control block 154. The bit line and source line voltages decrease for word line locations farther from the VBL/VSL voltage terminal of the I/O control block 154. For example, if the array 150 of resistive memory cells 151 contains 1024 rows of memory cells, and assuming that row 1023 is closest to the I/O control block 154 and row 0 is farthest from the I/O control block 154, the bit line and source line voltages will be higher at row 1023 (closer to the VBL/VSL voltage terminal) than the bit line and source line voltages at row 0 (farther from the VBL/VSL voltage terminal). The increased voltages at the rows closer to the I/O control block 154 results in a current reduction in the resistive memory cells at the rows nearer to the I/O control block 154. The location compensation module 110 may then compensate for this effect by determining the location of a selected word line, for example by receiving a word line address for the selected row, and determining a word line voltage that is based on how far that location is from the VBL/VSL voltage terminal of the I/O control block to which the selected memory cell within the selected row is connected. The details of an exemplary word line voltage compensation scheme based on the location of a selected word line, such as can be used by a location compensation module 110, are further described with respect to FIGS. 5-6B below.

Figure 3:
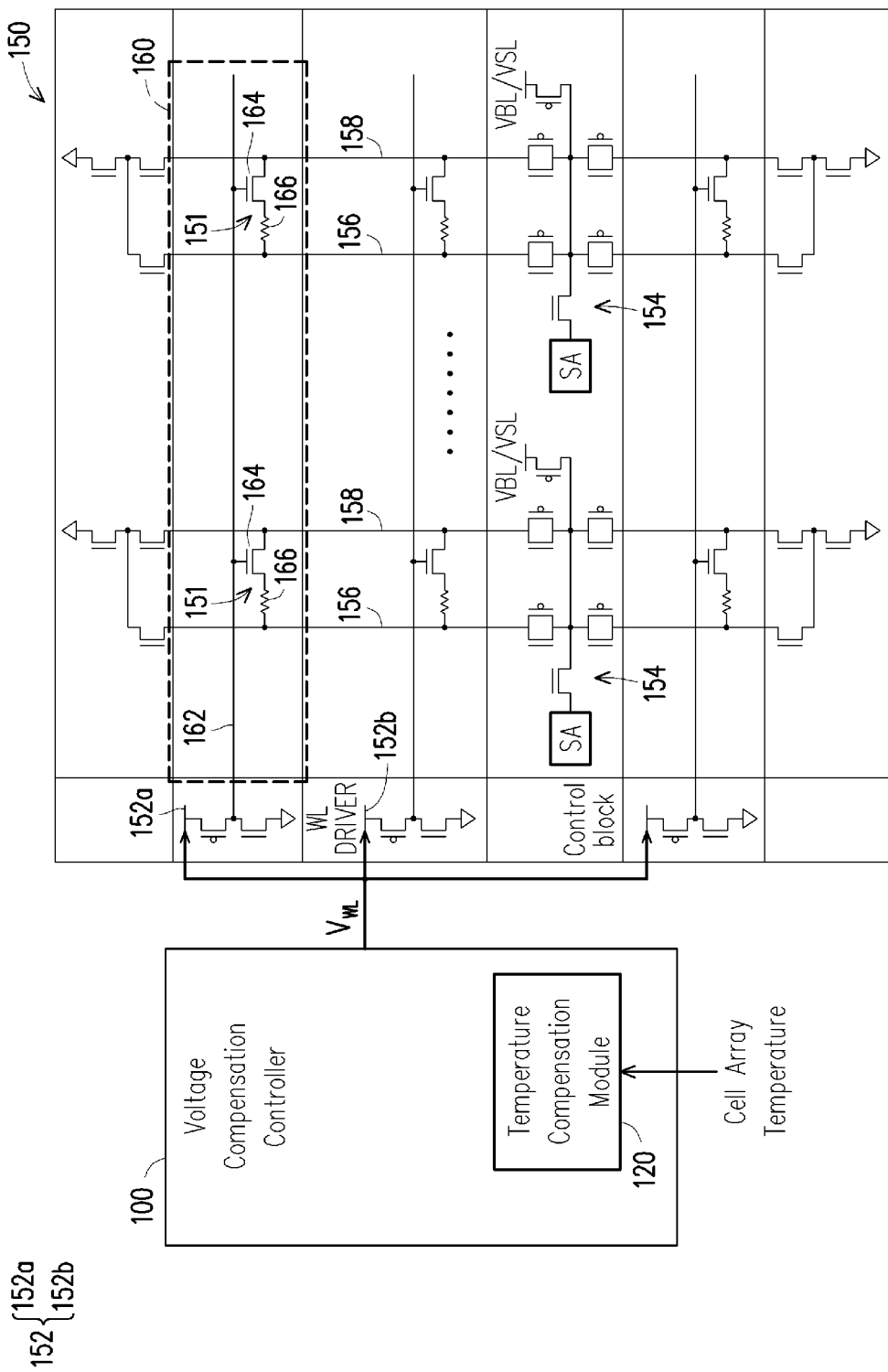
FIG. 3 is a block diagram generally illustrating another example voltage compensation controller operatively coupled to an array of resistive memory cells in accordance with some embodiments.

FIG. 3 is a block diagram generally illustrating another example of a voltage compensation controller 100 operatively coupled to a word line driver of an array 150 of resistive memory cells 151 in accordance with certain aspects of the present disclosure. In the example shown, the voltage compensation controller 100 includes a temperature compensation module 120. The temperature compensation module 120 may be configured to determine a word line voltage that is based on the temperature of the array 150 of resistive memory cells 151. For example, temperature compensation module 120 may determine a word line voltage based on the temperature of array 150 of resistive memory cells 151. The resistance of many electronic elements of the array of resistive memory cells, including the access transistors, depends on temperature. In general, the parasitic resistance of the array of resistive memory cells increases with temperature. In addition, the resistance of the access transistors, for example MOSFETs used as access transistors, also increases with increasing temperature. The read margin of a resistive memory cell 151 depends on the difference between the read current of the resistive element 166 of the cell in the low and high resistive states. For example, the read margin of the resistive memory cell 151 depends on the difference between the read current that flows through the resistive element 166 in a high or low resistive state. The temperature compensation module 120 may then determine the temperature of the array of resistive memory cells and determine a word line voltage that is based on the temperature. The details of an exemplary word line voltage compensation scheme based on the temperature of the array 150 or resistive memory cells 151, such as can be used by a temperature compensation module 120, are further described with respect to FIGS. 7A-9 below.

Figure 4:
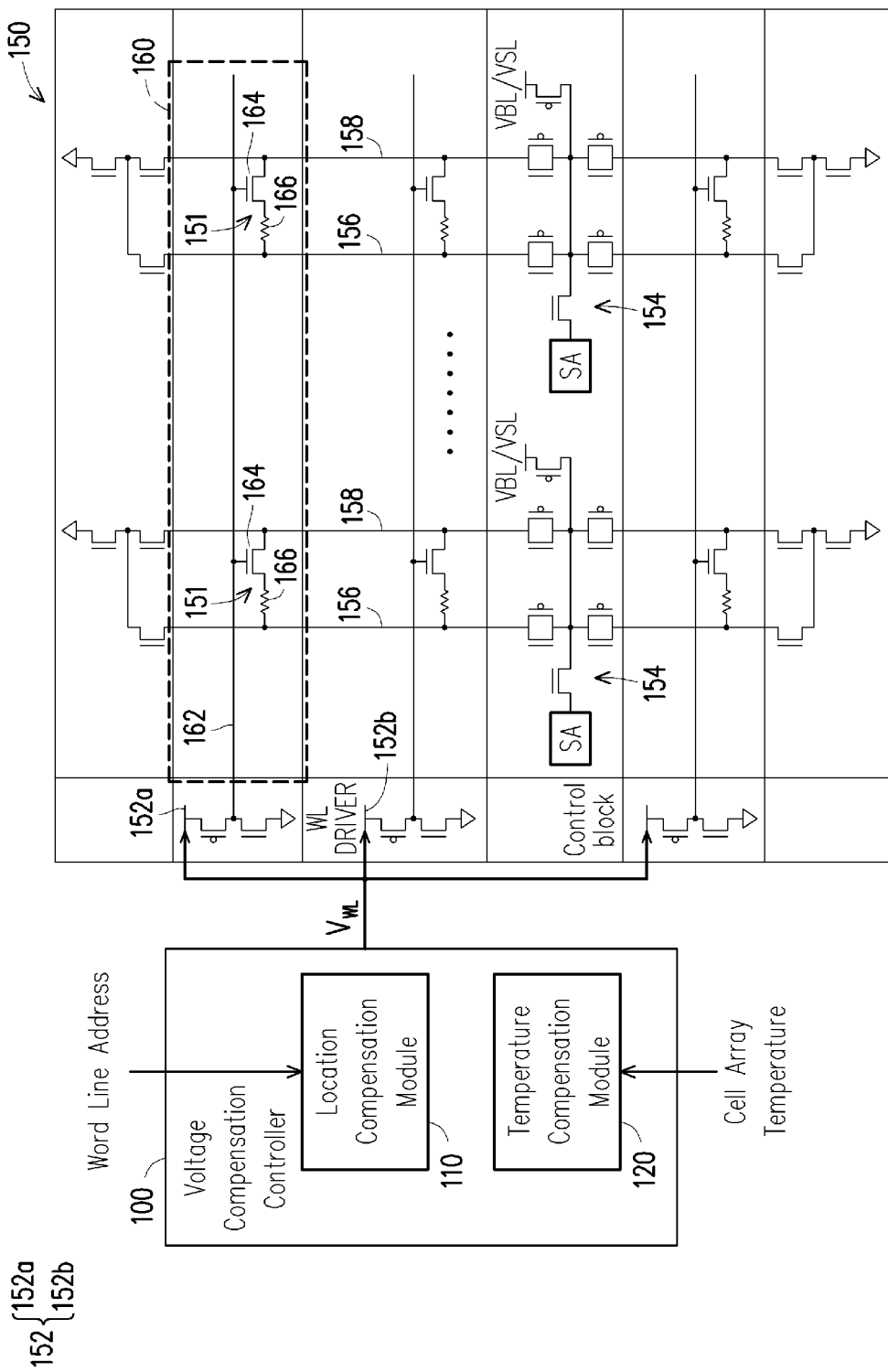
FIG. 4 is a block diagram generally illustrating another example voltage compensation controller operatively coupled to an array of resistive memory cells in accordance with some embodiments.

FIG. 4 is a block diagram generally illustrating another example of a voltage compensation controller 100 operatively coupled to a word line driver of an array 150 of resistive memory cells 151 in accordance with certain aspects of the present disclosure. In the example shown, voltage compensation controller 100 includes both the location compensation module 110 and the temperature compensation module 120. In the example illustrated, the determination of the word line voltage to be applied to a selected word line may include both a determination of the word line voltage based on location of the selected word line and the temperature of the array of resistive memory cells independently. As such, the determined word line voltage by both the location compensation module 110, as illustrated and described with respect to FIG. 2, and the temperature compensation module 120, as illustrated and described with respect to FIG. 3, may be combined such that voltage compensation controller 100 determines a total word line voltage to be applied to the selected word line of the array of resistive memory cells to adequately compensate for location and temperature variation. The details of an exemplary word line voltage compensation scheme based on a combination of both the location compensation module 110 and the temperature compensation module 120 is further described with respect to FIG. 10 below.

Figure 5:
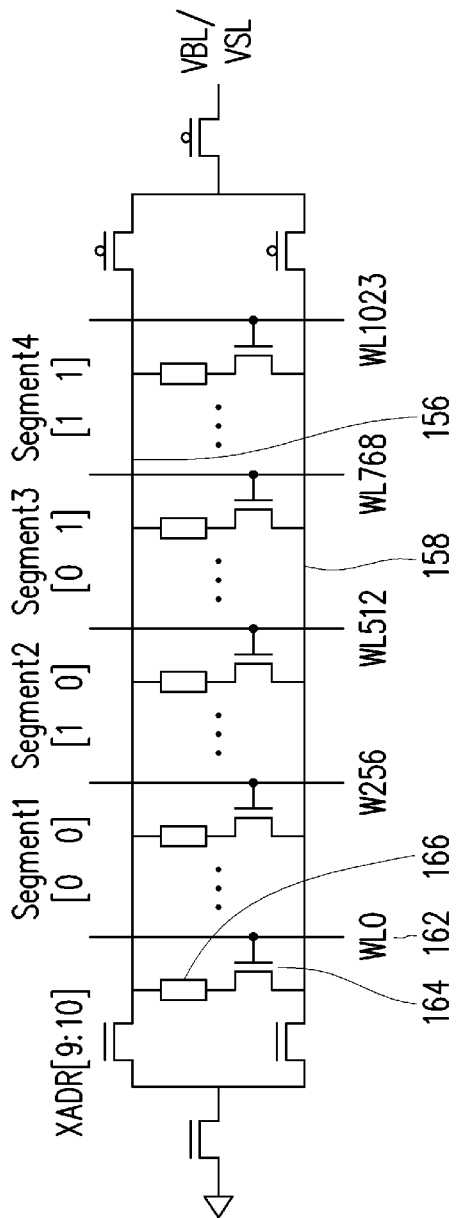
FIG. 5 is a circuit diagram illustrating an example location compensation scheme for a resistive memory device in accordance with some embodiments.

FIG. 5 is a circuit diagram illustrating aspects of an example location compensation scheme. In the example shown, a column of an array of resistive memory cells includes 1024 memory cells, each corresponding with a row of the array and connected to one of 1024 word lines WL0 through WL1023. As stated above, the bit line and source line voltages decrease for word line locations that are farther away from the VBL/VSL voltage terminal. The current allowed to pass through the access transistor of a memory cell depends on the inverse of the difference between the voltage applied to the gate and the source of the transistor. In addition, due to the body effect, the threshold voltage of the access transistor increases with the voltage applied to the source of the transistor. Therefore, the current allowed to pass through the access transistor is proportional to:

$$I \propto \frac{1}{V_{WL} - V_{SL} - V_{TH}(V_{SL})}$$

where VWL is the word line voltage applied to the gate of an access transistor, VSL is the source line voltage at the source of the access transistor, and VTH is the threshold voltage of the access transistor and is also a function of VSL as shown. As a result, for higher source line voltages, the current allowed to pass through the access transistor will be lower. For example, if the word line 162 corresponding with word line address 1023 (e.g. nearest to the bit line source) is selected for application of a word line voltage for read/write access to resistive memory element 164, the read/write current allowed to pass through access transistor 162 will be lower than a corresponding read/write current allowed to pass through the access transistor connected to the word line corresponding to word line address 0 (e.g. farthest from the bit line source) because VSL will be higher at word line 162.

To compensate for this variation in the read/write current, the voltage applied to the word line 162 can be adjusted. In some embodiments, the voltage applied to the word line of every individual row in the array of resistive memory cells may be determined or adjusted individually. Alternatively, in other embodiments, rows of cells may be grouped such that word line voltage adjustments may be applied to a group of rows. In other words, the word lines may be segmented into groups based on their location relative to the bit line source. In the illustrated embodiments, the VBL/VSL voltage terminal is located within the I/O control block 154 and connected to the bit lines 156 and source lines 158 of the array 150 of resistive memory cells 151. In the example shown, the 1024 word lines are segmented into four groups with the word lines corresponding to word line addresses WL0-WL255 associated with Segment 1, WL256-WL511 associated with Segment 2, WL512-WL767 associated with Segment 3, and WL768-WL1023 associated with Segment 4. As such, only four word line voltage adjustment levels to compensate for location variations are used, rather than 1024 levels, simplifying a compensation circuit needed to determine the compensation adjustment. The embodiment shown uses two-bit identifiers to select among the four segments.

Figures 6A, 6B:
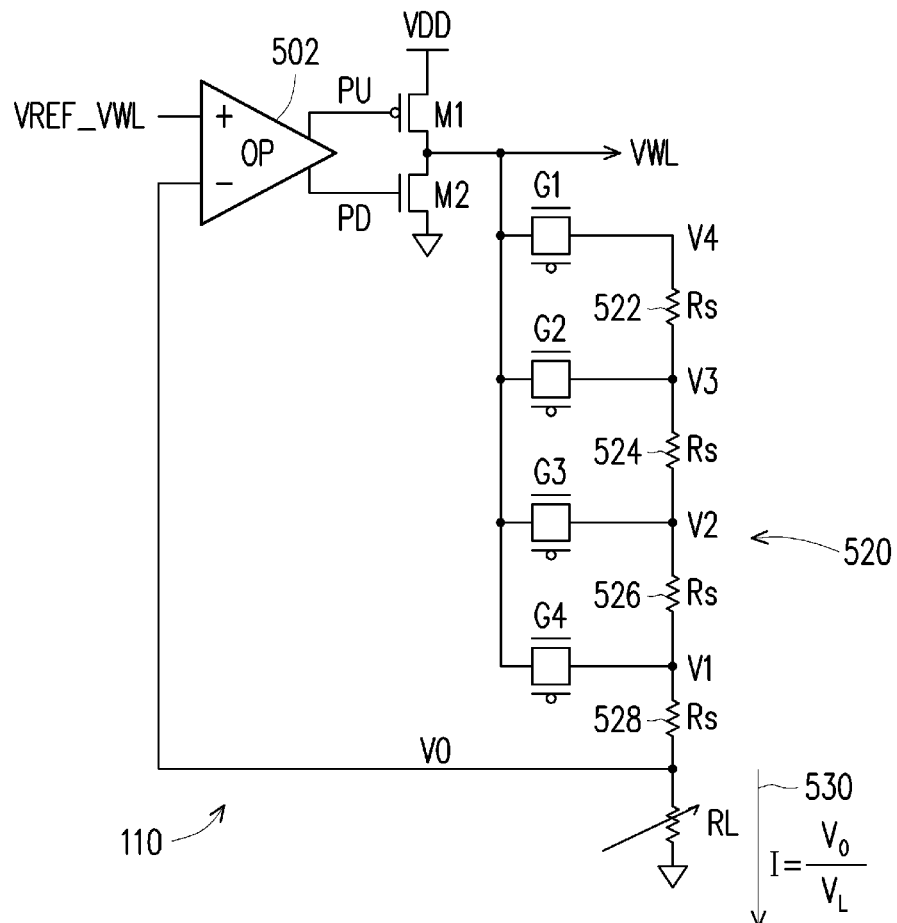
FIG. 6A is a circuit diagram illustrating an example word line voltage generator circuit in accordance with some embodiments.
FIG. 6B is an example of an address table corresponding to the voltage generator circuit of FIG. 6A.

FIG. 6A is a circuit diagram illustrating an example of the location compensation module 110 shown in FIG. 2, which is configured to generate the word line voltage VWL output to a selected word line 162 of the array 150 based on the location of the selected word line. In the example shown, the location compensation module 110 comprises a two-stage push-pull operational amplifier (OP Amp) 502, a resistor ladder 520, switches G1-G4, tunable resistor RL, and switches M1-M2. Resistor ladder 520 includes resistors 522, 524, 526, and 528, all having the same Rs resistance value. A constant current source I indicated by the arrow 530 is created by the illustrated closed loop arrangement. The OP amp 502 has one input that receives a voltage V0, which is generated at the junction of the resistor ladder 520 and the tunable resistor RL. A second input of the OP amp 502 receives a word line reference voltage VREF_VWL. In the illustrated example, the V0 voltage level is approximately equal to VREF_VWL voltage level. The output voltage VWL has four levels V1-V4, with the voltage increment ΔV between adjacent resistors in the resistor ladder 520 being determined according to $$\Delta V = I * Rs$$

Where I is the constant current source based on the V0 voltage and RL resistance value and Rs is the resistance value of each of the resistors Rs.

In the illustrated example, the voltage levels are selected using two-bit logic to open normally-closed switches G1-G4. Bits 9 and 10 are added to the word line address, identifying the various segments or groupings of word lines according to their location, as shown in the address table provided in FIG. 6B. According to the address table shown in FIG. 6B, if a word line address associated with segment 1 as shown in FIG. 5 is selected, such as word line 162, the word line address will also be associated with a logic value of 00, turning on switch G4 resulting in a word line voltage $V_{WL}$ equaling voltage level V1, the lowest of the four voltage levels V1-V4.

Figure 7A:
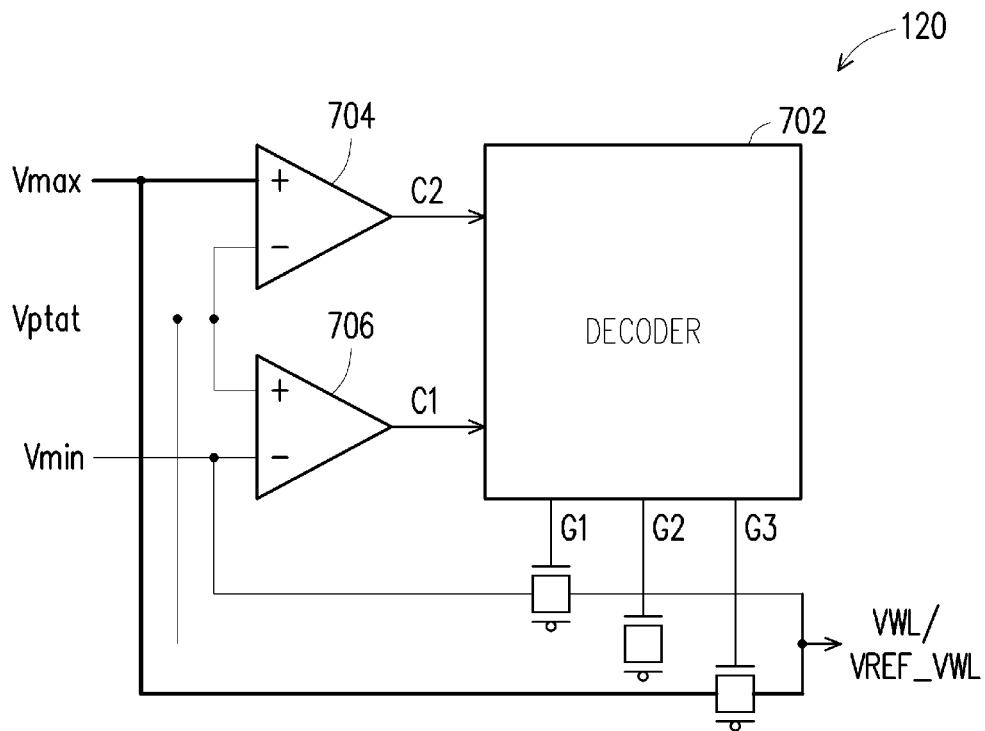
FIG. 7A is a circuit diagram illustrating another example word line voltage compensation scheme in accordance with some embodiments.

FIG. 7A is a circuit diagram illustrating another example word line voltage compensation scheme. FIG. 7A shows one example of the temperature compensation module 120 of FIG. 3, which is configured to generate a word line voltage based on the temperature of the array 150 of resistive memory cells 151. In the example shown, the temperature compensation module 120 includes a decoder 702, comparators 704 and 706, and switches G1-G3. The decoder 702 is configured to output voltage VREF_VWL from among a maximum voltage Vmax, a minimum voltage Vmin, and a voltage proportional to an absolute temperature Vptat. The output voltage VREF_VWL may be output as the word line voltage VWL, or may also be used as the input reference voltage VREF_VWL for further word line voltage compensation based on the location of the selected word line, such as VREF_VWL in FIG. 6A.

As stated above, variation in bit line current due to increased temperature of an array of resistive memory cells can result in the reduction of the read margin for a resistive memory cell 151, potentially resulting in decreased data reliability. The read current is proportional to the read voltage applied by the bit/source lines during a read operation divided by the resistivity of the read circuit. The major components of the resistivity of the read circuit are the resistivity of the access transistor 164 in the "ON" state, the resistance of the resistive element 166, and the parasitic resistance of the circuit. These components are in series and therefore are additive, and the resulting read current is the Iread equation:

$$I_{read} \propto \frac{V_{read}}{R_{state} + R_{on} + R_{par}}$$

$$I_{Low} \propto \frac{V_{read}}{R_{HRS} + R_{on} + R_{par}}$$

$$I_{High} \propto \frac{V_{read}}{R_{LRS} + R_{on} + R_{par}}$$

where Rstate is the resistance of the resistive element 166 either in the high or low resistive state, Ron is the resistance of the access transistor 164, and Rpar is the parasitic resistance of the read circuit. The read margin is IHigh−Ilow, each of which is shown above corresponding to the resistive element 166 of the resistive memory cell 151 being in the low resistive state with $R_{LRS}$ or the high resistive state with $R_{HRS}$, respectively.

As can be seen from the equations above, the difference between the high and low read currents decreases as the resistances of the access transistor, Ron, and the electronic components contributing to the parasitic resistance of the read circuit, Rpar, increase with temperature. This decreases the read margin, e.g. the ability to resolve between high and low resistive states of the resistive element 166 of the memory cell. The maximum read margin occurs when Ron and Rpar are zero. One method for increasing the read margin as temperature increases is to increase the word line voltage applied to the gate of the access transistor, thereby reducing the resistance of the access transistor, Ron, and compensating for the increase of Ron due to an increase of temperature of the array of resistive memory cells. Generating a word line voltage (Vptat) that is proportional to the temperature of the memory array, e.g. directly increases or decreases with respective increases or decreases in memory array temperature, may be used to compensate for changes in read current arising from read circuit temperature variations. However, the word line voltage is limited on the low side by a minimum voltage needed to ensure a read operation, e.g. insure that the word line voltage is greater than the threshold voltage of the access transistor. The word line voltage is limited on the high side by a maximum voltage that is within the operating range of the access transistor, in some embodiments. Another consideration for limiting the word line voltage on the high side is the reliability of the access of the transistor over time to avoid/delay the time-dependent gate oxide breakdown (TDDB) effect.

Figure 7B:
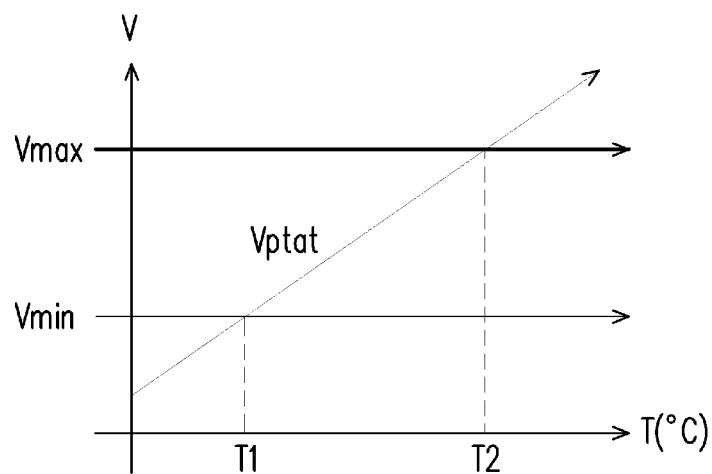
FIG. 7B is a chart illustrating Vptat varying with temperature.
Figures 7C, 7D:
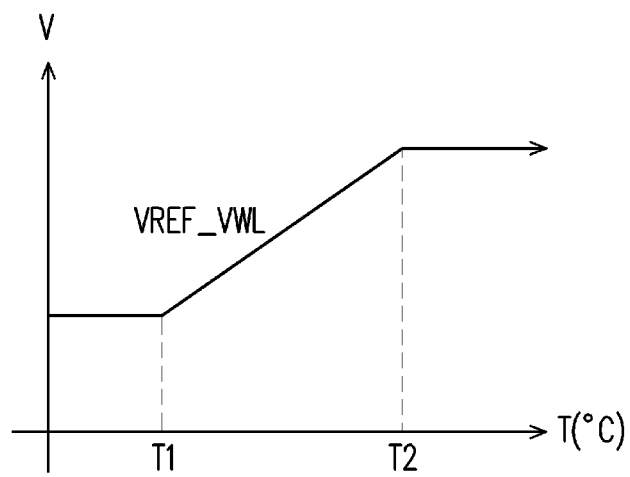
FIG. 7C illustrates the chart of FIG. 7B with minimum and maximum voltage levels.
FIG. 7D is an example of an address table corresponding to the voltage generator circuit of FIG. 7A.

In the example shown in FIG. 7B, Vptat is shown as linearly increasing with temperature. At temperature T1, Vptat is equal to Vmin, and at higher temperature T2, Vptat is equal to Vmax. In the example shown, Vptat linearly increases with temperature; however, Vptat may increase with temperature in any number of ways, for example, exponentially, logarithmically, quadratically or by any other binomial equation, discretely in steps, by an empirically determined amount, or by any other way. In the example of FIG. 7A, Vptat is compared with Vmax resulting in logic output C2 from the comparator 704, and Vptat is compared with Vmin resulting in logic output C1 from the comparator 706. The decoder 702 uses the state table shown at FIG. 7D to turn on switch G1 if Vptat is lower than Vmin, thereby selecting Vmin as the VREF_VWL output. The decoder 702 turns on switch G3 if Vptat is higher than Vmax, thereby selecting Vmax as the VREF_VWL output, and the decoder 702 turns on switch G2 if Vptat is both higher than Vmin and lower than Vmax, thereby selecting Vptat as the VREF_VWL output. FIG. 7C illustrates the resulting VREF_VWL output of the example word line voltage control module as a function of temperature.

Figure 8:
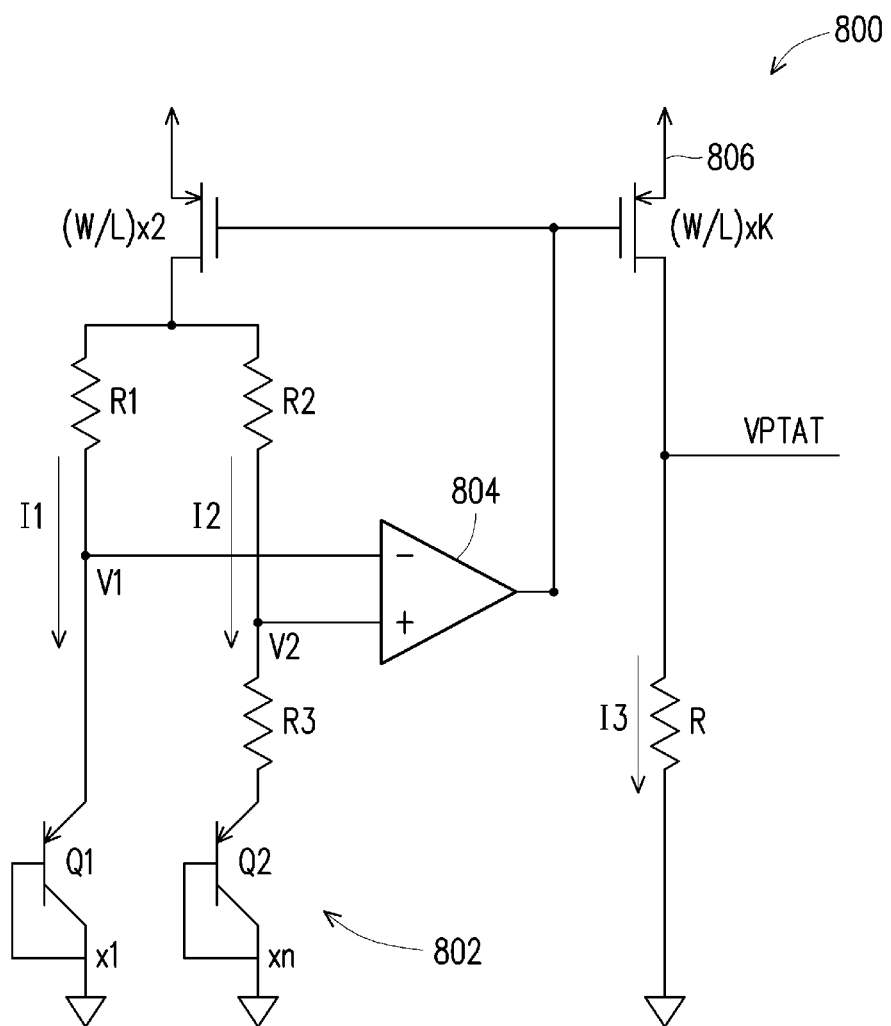
FIG. 8 is an example of a circuit for determining a Vptat voltage in accordance with some embodiments.
Figure 9:
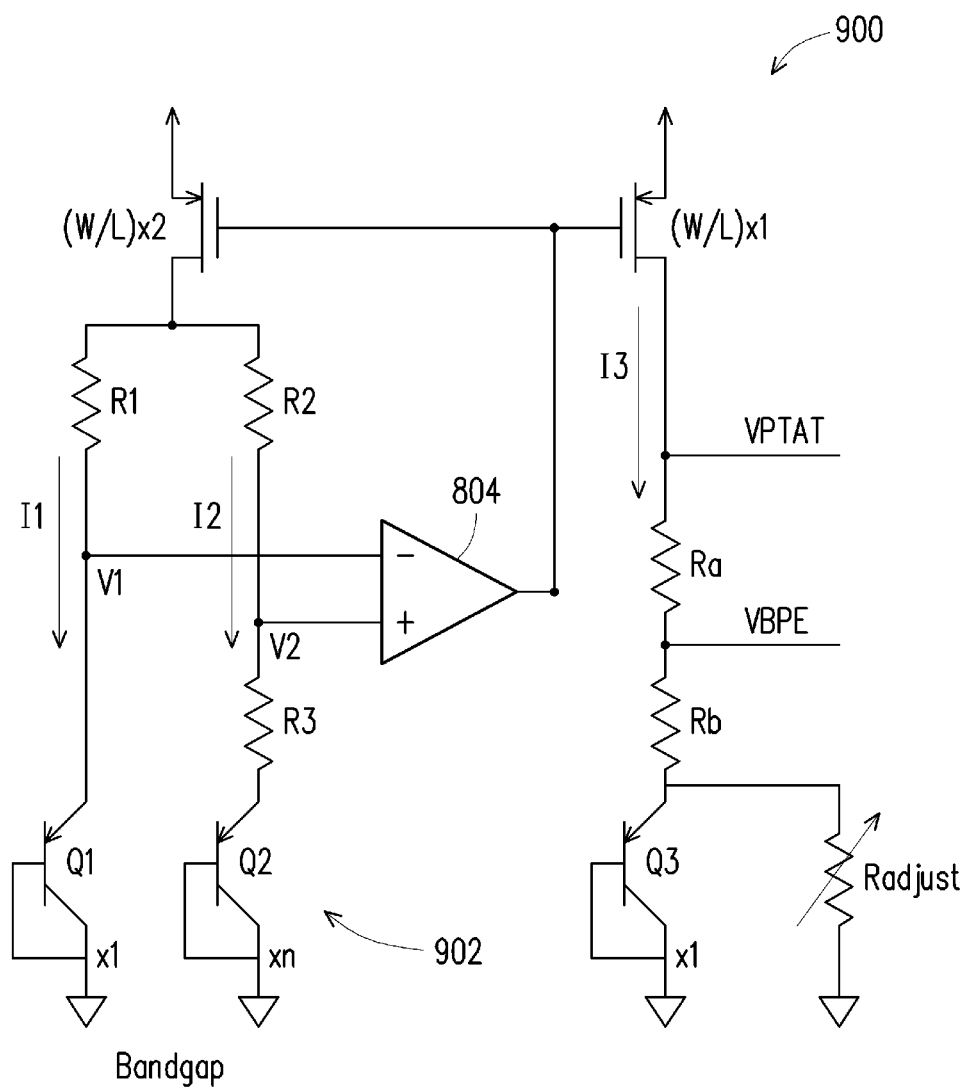
FIG. 9 is a circuit diagram illustrating another example circuit for generating a voltage proportional to absolute temperature Vptat in accordance with some embodiments.

FIGS. 8 and 9 are circuit diagrams illustrating example voltage reference circuits 800, 900 for generating a voltage proportional to absolute temperature Vptat using bandgap reference (BGR) circuits. The Vptat, for example, is provided as an input to the comparators 704 and 706 shown in FIG. 7A. A bandgap voltage reference circuit, for example circuit 802, is a temperature independent voltage reference circuit that outputs a fixed (constant) voltage regardless of temperature changes. The Vptat generation circuit 800 couples a transistor and resistor R with BGR circuit 802 to output a voltage Vptat that varies linearly with temperature. As illustrated in FIG. 8, V1 and V2 are equal due to OP Amp 804, and choosing R1=R2 leads to I1=I2. Using the BJT current formula, I1=I2=Vt*ln(n)/R3, where Vt is linearly proportional to temperature and n is the ratio of emitter areas of transistors Q1 and Q2. The current I3 is proportional to I2 applied to the gate of transistor 806 by a factor of K, leading to Vptat=I3*R=(K*I2)*R=K*R*Vt*ln(n)/R3. Because Vt varies linearly with temperature, Vptat also varies linearly with temperature.

FIG. 9 is a circuit diagram illustrating another example circuit for generating a Vptat voltage. In the example shown, the Vptat generation circuit 900 generates a voltage that is non-linearly proportional to Vptat. As shown in FIG. 9, the current I3 corresponds to I3 of FIG. 8 and varies linearly with temperature. However, Vptat in FIG. 9 is proportional to the product of the current I3 with the total resistance along its path, or in other words, I3*(Ra+Rb+R(Q3)/Radjust). The resistance of the transistor Q3, R(Q3), is non-linear, and its nonlinearity is changed by changing Radjust.

Figure 10:
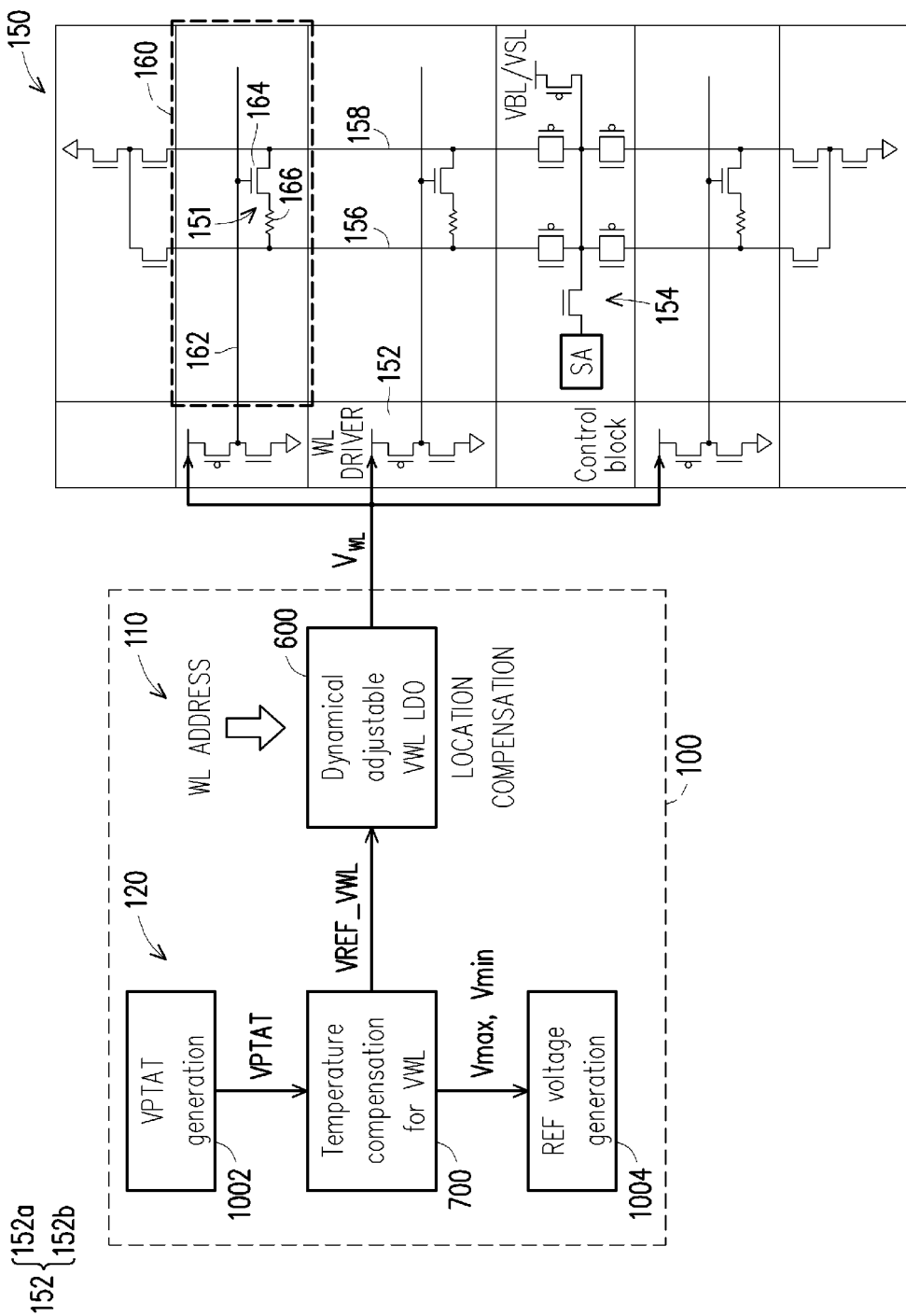
FIG. 10 is a block diagram generally illustrating another example voltage compensation controller operatively coupled to an array of resistive memory cells in accordance with some embodiments.

FIG. 10 is a block diagram illustrating another example of a voltage compensation controller 100 operatively coupled to a word line driver 152 of an array 150 of resistive memory cells 151 in accordance with certain aspects of the present disclosure. In the example shown, the voltage compensation controller 100 determines word line voltage VWL based both on location of the selected word line and the temperature of the array 150 of resistive memory cells 151. In the embodiment shown, a Vptat generator 1002 of the temperature compensation module 120 receives a temperature of the array 150 of resistive memory cells 151, and the temperature compensation module 120 outputs a VREF_VWL signal. For example, the Vptat generator 1002 generates Vptat as described above in relation to FIG. 7A depending on the received temperature of the array 150, and the temperature compensation module 120 compares Vptat to minimum and maximum voltages provided by a reference voltage generator 1004 and determines an output VREF_VWL based on the comparison. In the example shown in FIG. 10, VREF_VWL may be an input to the location compensation module 110 along with the word line address of a selected word line as shown in FIG. 6A. The location compensation module 110 may then determine a word line voltage for selected word line 162 based on the location of selected word line 162 as described above in relation to FIG. 6A.

Figure 11:
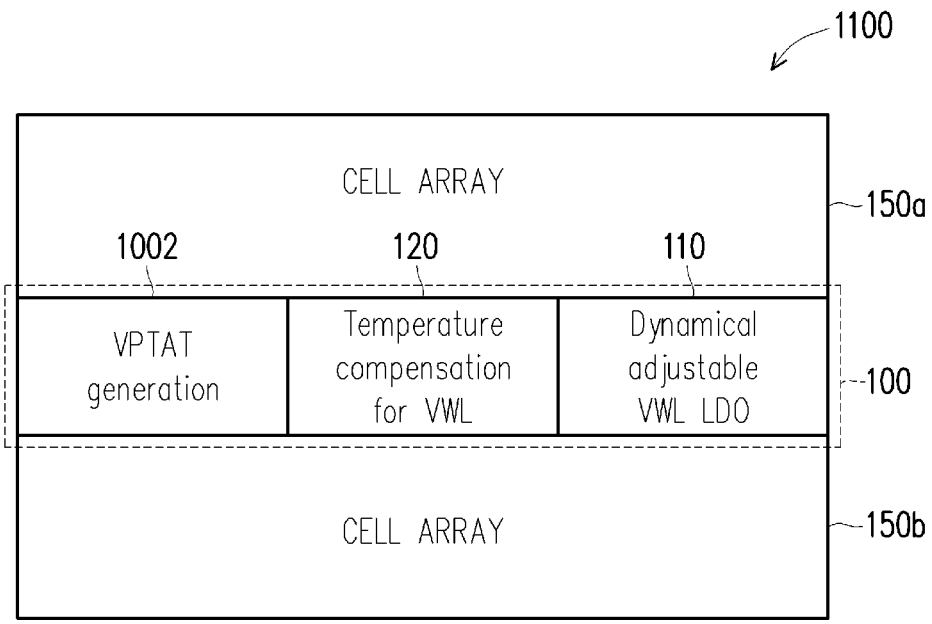
FIG. 11 is a block diagram illustrating an example placement of a voltage compensation controller in relation to an array or arrays of resistive memory cells in accordance with some embodiments.

FIG. 11 is a block diagram illustrating an example memory device 1100, showing placement of a voltage compensation controller 100 in relation to the arrays of resistive memory cells 150a, 150b. In the example shown, the voltage compensation controller 100 is located between arrays, or subarrays 150a, 150b of the same array 150, of resistive memory cells. Vptat generator 1002 is located next to, or in proximity to, temperature compensation module 120. Temperature compensation module 120 is located next to, or in proximity to location compensation module 110 in the illustrated example, though other placements are within the scope of the disclosure.

Figure 12:
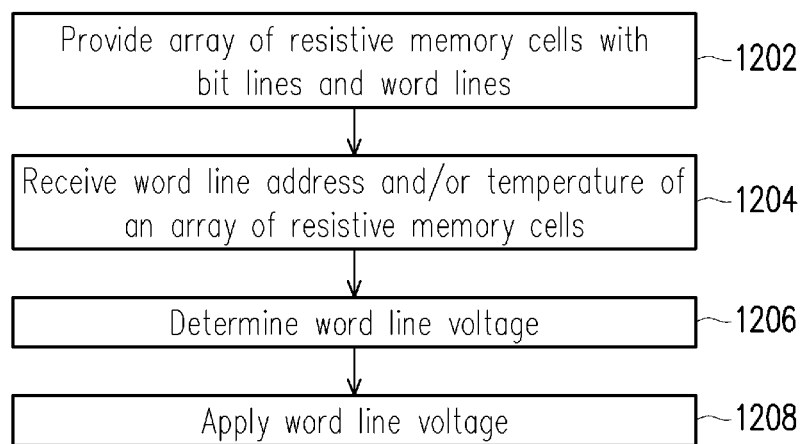
FIG. 12 is a flowchart of a method for determining a word line voltage that compensates for temperature and location of a selected word line in accordance with some embodiments.

FIG. 12 is a flowchart of a method 1200 for determining a word line voltage that compensates for temperature and location of a selected word line. The method 1200 can be performed, for example, by a voltage compensation controller 100, such as a voltage compensation controller 100 in any of FIGS. 1-4.

In the example shown, an array 150 of resistive memory cells 151, such as shown in FIG. 1, is provided in an operation 1202. As noted above, the array 150 includes bit lines 156 and word lines 162. In operation 1204, a word line address and/or a temperature of the array 150 of resistive memory cells 151 is received.

In operation 1206, a word line voltage is determined. In some examples, the word line voltage is selected from a plurality of predefined voltage levels. The selected word line voltage VWL is applied to a selected one of the plurality of word lines 162 of the array 150 of resistive memory cells 151 in operation 1208. In some examples, a location of a selected one of the plurality of word lines 162 of the array 150 of resistive memory cells 151 is determined, and the word line voltage VWL is selected based on the location of the selected word line, such as illustrated in FIG. 2. In further embodiments, a temperature of the array 150 of resistive memory cells 151 is determined and the word line voltage VWL is determined based on the determined temperature, such as illustrated in FIG. 3. In still further embodiments, the word line voltage VWL is determined based on a combination of both the location of the selection word line and the determined temperature, such as illustrated in FIG. 4.

In further embodiments, the array 150 of resistive memory cells 151 are segmented into a plurality of predetermined segments based on a location from an I/O control block 154 connected to the plurality of bit lines 156. A first predetermined word line voltage corresponding to a segment that is farther from the I/O control block 154 is lower than a second predetermined word line voltage corresponding to a segment that is closer to the I/O control block 154. Further, a temperature of the array 150 of resistive memory cells 151 is determined, a minimum word line voltage is determined at a first temperature and a maximum word line voltage is determined at a second temperature higher than the first temperature. A word line voltage is determined that increases in proportion to the temperature of the array 150 of resistive memory cells 151 from the minimum word line voltage at the first temperature to the maximum voltage at the second temperature higher than the first temperature.

Disclosed embodiments thus provide improvements to the read and write margins. In one example, a memory device includes an array 150 of resistive memory cells 151 with a plurality of word lines 162 connected to the array 150 of resistive memory cells 151. A voltage compensation controller 100 is configured to determine a word line voltage to be applied to a selected word line of the plurality of word lines 162. A word line driver 152 is configured apply the determined word line voltage to the selected word line.

An accordance with other disclosed examples, a voltage compensation controller 100 for a resistive memory cell array has an input terminal configured to receive a word line address corresponding to a word line 162 of an array 150 of resistive memory cells 151. A location compensation module 110 is configured to select one of a predetermined number of word line voltages based on a location of the word line address relative to an I/O control block 154 of the array 150 resistive memory cells. A temperature compensation module 120 is configured to determine a minimum word line voltage at a first temperature and a maximum word line voltage at a second temperature higher than the first temperature. An output terminal is configured to output a word line voltage based on outputs of the location compensation module 110 and the temperature compensation module 120.

In accordance with still further disclosed examples, a method includes providing an array 150 of resistive memory cells 151 having a plurality of word lines 162 connected to the array 150 of resistive memory cells 151. A word line address is received, and a word line voltage is determined. Determining a word line voltage includes selecting a word line voltage from a plurality of predefined voltage levels. The selected word line voltage is applied to a selected one of the plurality of word lines 162 of the array 150 of resistive memory cells 151.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising
an array of memory cells comprising a plurality of word lines;
a voltage compensation controller configured to:
receive a first address corresponding to a first selected word line of the plurality of word lines,
determine, based on the first address, a first segment from a plurality of segments in which the first selected word line is located in, wherein the plurality of word lines are grouped into the plurality of segments each comprising a predetermined number of word lines of the plurality of word lines,
determine, based on a first segment identifier, a first word line voltage comprising a first predetermined word line voltage associated with the first segment in which the first selected word line is located in to be applied to the first selected word line, wherein each segment of the plurality of segments is associated with a predetermined word line voltage, wherein the first segment identifier is appended as additional bits to a first word line address of the first selected word line, the segment identifier identifying the first segment of the first word line according to its location, and wherein the first word line voltage is generated by switching one or more switches controlling a resistor ladder of the voltage compensation controller based on the segment identifier,
receive a second address corresponding to a second selected word line of the plurality of word lines, and
determine a second word line voltage to be applied to the second selected word line, wherein the second word line voltage to be applied to the second selected word line is lower than the first word line voltage to be applied to the first selected word line.

2. The memory device of claim 1, wherein the first selected word line of the plurality of word lines is nearer to an I/O block of the memory device than to the second selected word line of the plurality of word lines.

3. The memory device of claim 1, wherein the plurality of word lines are segmented into the plurality of segments based a distance of each of the plurality of word lines from the I/O block.

4. The memory device of claim 3, wherein the plurality of segments comprises the first segment comprising the first selected word line and a second segment comprising the second selected word line, wherein the first segment is assigned the first predetermined word line voltage, and wherein the second segment is assigned a second predetermined word line voltage.

5. The memory device of claim 1, wherein the voltage compensation controller comprises a location compensation module and a temperature compensation module.

6. The memory device of claim 5, wherein the location compensation module determines a location compensated first word line voltage to be applied to the first selected word line based on a first distance of the first selected word line from an I/O block of the memory device.

7. The memory device of claim 5, wherein the temperature compensation module determines a temperature compensated first word line voltage to be applied to the first selected word line based on a first temperature of the first selected word line.

8. The memory device of claim 1, wherein the array of resistive memory cells includes a first sub array and a second sub array, and wherein the voltage compensation controller is positioned between the first array and the second sub array.

9. A method, comprising:
receiving a first address corresponding to a first selected word line of a plurality of word lines of a memory device;
determining, based on the first address, a first segment from a plurality of segments in which the first selected word line is located in, wherein the plurality of word lines are grouped into the plurality of segments each comprising a predetermined number of word lines of the plurality of word lines;
determining, based on a first segment identifier, a first word line voltage comprising a first predetermined word line voltage associated with the first segment in which the first selected word line is located in, wherein each segment of the plurality of segments is associated with a predetermined word line voltage, wherein the first segment identifier is appended as additional bits to a first word line address of the first selected word line, the segment identifier identifying the first segment of the first word line according to its location, and wherein the first word line voltage is generated by switching one or more switches controlling a resistor ladder of the voltage compensation controller based on the segment identifier;

receiving a second address corresponding to a second selected word line of the plurality of word lines; and determining a second word line voltage to be applied to the second selected word line, wherein the second word line voltage is lower than the first word line voltage.

10. The method of claim 9, further comprising:

segmenting the plurality of word lines of the array of resistive memory cells into the plurality of segments based on a location of each of the plurality of word lines from an I/O block; and associating the predetermined word line voltage of a plurality of predetermined word line voltages to each of the plurality of segments.

11. The method of claim 10, wherein associating the predetermined word line voltage of the plurality of predetermined word line voltages to each of the plurality of segments comprises:

associating the first predetermined word line voltage to the first segment; and associating a second predetermined word line voltage to the second segment, wherein the second predetermined word line voltage is lower than the first predetermined word line voltage.

12. The method of claim 9, further comprising:

determining a temperature of the array of resistive memory cells;

determining a minimum word line voltage at a first temperature;

determining a maximum word line voltage at a second temperature higher than the first temperature;

determining a temperature compensated word line voltage for the first word line voltage that increases in proportion to the temperature of the array of resistive memory cells from the minimum word line voltage at the first temperature to the maximum voltage at the second temperature higher than the first temperature.

13. The method of claim 12, wherein the temperature compensated word line voltage increases linearly from the minimum word line voltage at the first temperature to the maximum word line voltage at the second temperature.

14. A memory device comprising an array of memory cells comprising a plurality of word lines;

an Input/Output (I/O) circuit connected to the array of memory cells; and a voltage compensation controller configured to:

receive a first address corresponding to a first selected word line of the plurality of word lines, determine, based on the first address, a first segment from a plurality of segments in which the first selected word line is located in, wherein the plurality of word lines are grouped into the plurality of segments each comprising a predetermined number of word lines of the plurality of word lines, determine, based on a first segment identifier, a first word line voltage comprising a first predetermined word line voltage associated with the first segment in which the first selected word line is located in to be applied to the first selected word line, wherein each segment of the plurality of segments is associated with a predetermined word line voltage, wherein the first segment identifier is appended as additional bits to a first word line address of the first selected word line, the segment identifier identifying the first segment of the first word line according to its location, and wherein the first word line voltage is generated by switching one or more switches controlling a resistor ladder of the voltage compensation controller based on the segment identifier, receive a second address corresponding to a second selected word line of the plurality of word lines, and determine a second word line voltage to be applied to the second selected word line, wherein the second word line voltage to be applied to the second selected word line is lower than the first word line voltage to be applied to the first selected word line.

15. The memory device of claim 14, further comprising a word line driver configured to:

apply the first word line voltage to the selected first word line; and apply the second word line voltage to the selected second word line.

16. The memory device of claim 14, wherein the voltage compensation controller is further configured to compensate the first word line voltage based on a temperature of the array of memory cells.

17. The memory device of claim 14, wherein the array of memory cells comprises a first sub array and a second sub array, wherein the voltage compensation controller is positioned between the first array and the second sub array.

18. The memory device of claim 14, further comprising a first temperature compensation circuit configured to determine a temperature compensation voltage comprising a minimum first word line voltage at a first temperature of the array of memory cells and a maximum first word line voltage at a second temperature of the array of memory cells, the second temperature being higher than the first temperature.

19. The memory device of claim 18, wherein the temperature compensation circuit is configured to determine the first temperature compensation voltage that increases in proportion to the temperature of the array of memory cells from the minimum word line voltage at the first temperature to the maximum word line voltage at the second temperature.

20. The memory device of claim 14, wherein the voltage compensation controller comprises the resistor ladder and a plurality of switches connected to control a resistance value of the resistor ladder, each of the plurality of switches being associated with a segment of the plurality of segments, wherein a corresponding first switch of the plurality of switches is switched on based on the segment identifier to determine the first word line voltage.

* * * * *